United States Patent [19]
Ghezzo

[11] 3,979,240
[45] Sept. 7, 1976

[54] METHOD OF ETCHING INDIUM TIN OXIDE

[75] Inventor: Mario Ghezzo, Ballston Lake, N.Y.

[73] Assignee: General Electric Company, Schenectady, N.Y.

[22] Filed: May 2, 1975

[21] Appl. No.: 573,843

[52] U.S. Cl. .................................. 156/8; 96/36.2; 156/17; 252/79.2
[51] Int. Cl.² .......................................... C23F 1/02
[58] Field of Search ............... 96/36.2, 38.3; 156/8, 156/17; 29/580; 250/211 J; 204/129.1, 192; 252/79.1, 79.2

[56] References Cited
UNITED STATES PATENTS

| | | | |
|---|---|---|---|
| 2,371,529 | 3/1945 | Loose | 252/79.2 |
| 3,121,852 | 2/1964 | Boyd et al. | 427/91 X |
| 3,348,987 | 10/1967 | Stark et al. | 156/17 |

OTHER PUBLICATIONS
Journal of the Electrochemical Society, A Chemical Polish for Snx Ploxi-x Te by J. Edward Coker, vol. 116, No. 7, 7/1969, p. 1021.

*Primary Examiner*—William A. Powell
*Attorney, Agent, or Firm*—Julius J. Zaskalicky; Joseph T. Cohen; Jerome C. Squillaro

[57] ABSTRACT

A method of etching a desired pattern in a layer of indium tin oxide formed on a substrate of a semiconductor or an insulating material in which the desired pattern is formed of a hardened photoresist on the layer of indium tin oxide and thereafter the substrate and the indium tin oxide layer with the hardened resist thereon is immersed in a solution of concentrated hydrobromic acid for a time sufficient to etch away the indium tin oxide unmasked by the hardened photoresist.

13 Claims, 3 Drawing Figures

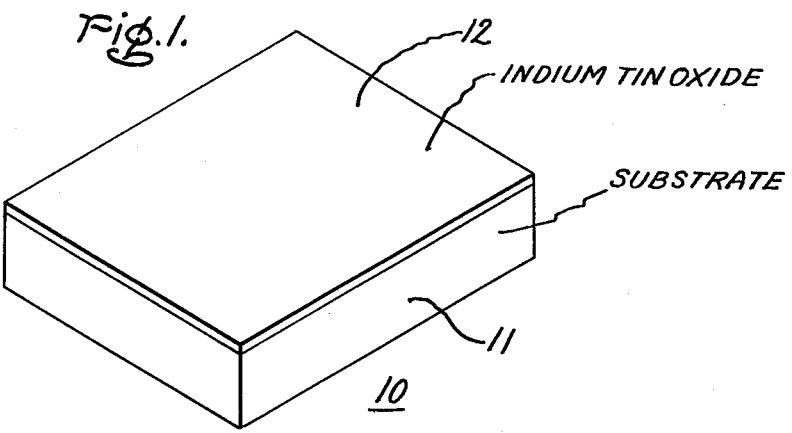
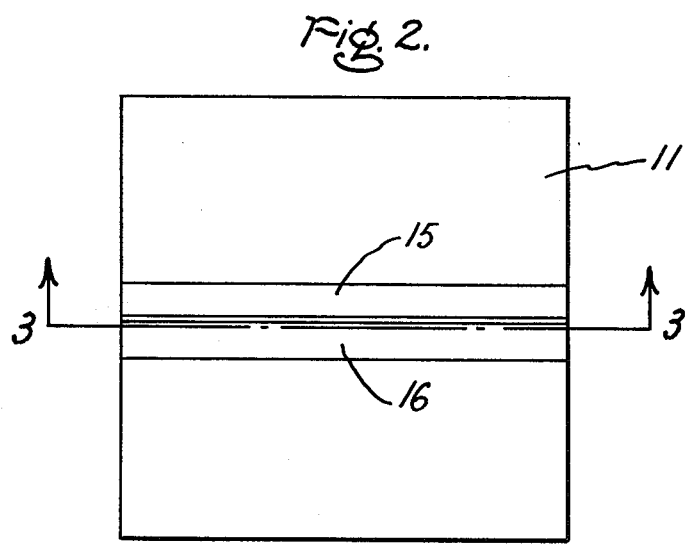
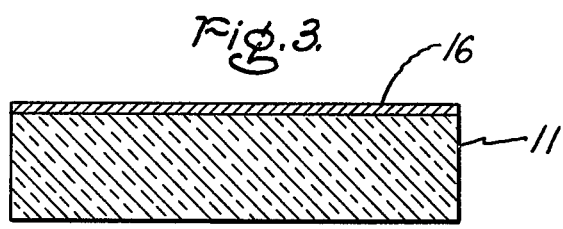

METHOD OF ETCHING INDIUM TIN OXIDE

This invention relates to the etching of patterns of conductive electrodes in a deposited layer of indium tin oxide in the course of providing transparent electrodes for semiconductor devices.

Indium tin oxide, particularly in which are provided large concentrations of indium oxide in relation to the tin oxide, for example, 90% indium oxide to about 10% tin oxide, is not only transparent but also has low resistivity. Such a combination of properties makes indium tin oxide highly suitable for use as electrode material in photosensitive semiconductor devices and arrays of such devices, such as disclosed in U.S. Pat. No. 3,805,062 and also disclosed in patent application Ser. No. 573,842 filed May 2, 1975, both of which are assigned to the assignee of this application. The use of indium tin oxide for the electrodes of such devices enables improvements in both sensitivity and spectral response to be obtained. Successful incorporation of conductive electrodes of such a material in a semiconductor device requires a suitable method for patterning or etching the layers of indium tin oxide. In addition, it is important to be able to closely space the transparent electrodes of indium tin oxide in order to provide high packing density and consequently high resolution in the image sensing arrays of such devices.

In the etching of indium tin oxide several conditions must be met to obtain satisfactory etching action. The etch mask utilized must not lift from the surface of the indium tin oxide layer during the etching thereof. The etch used must be able to etch through relatively thick layers of indium oxide without so impairing the adhesion bond of the mask to the indium tin oxide layer as to cause a lifting thereof and impairing the resultant pattern formed in the indium tin oxide layer. The etch utilized must also be relatively inert with respect to the substrate on which the indium tin oxide layer is formed. It is also desirable in the formation of conductive electrodes such as row or column stripes or lines that the edges of adjacent lines be relatively straight so that the conductive lines or stripes can be closely spaced to provide high packing density of devices in the array. Etches suggested in the prior art such as in an article by D. B. Fraser and H. D. Cook, entitled "Highly Conductive Transparent Films of Sputtered Indium Tin Oxide" in Journal of the Electrochemical Society, Solid-State Science and Technology, October 1972, pg. 1374, have proved unsatisfactory in respect to satisfying these criteria.

Accordingly an object of the present invention is to provide an improved method of etching layers of indium tin oxide.

Another object of the present invention is to provide a method of etching patterns of electrodes in a relatively thick layer of indium tin oxide formed on a various semiconductive and insulating substrates to close tolerances.

In carrying out the invention in one illustrative embodiment thereof there is provided a substrate comprising an insulating material such as silicon dioxide on which a relatively thick layer of indium tin oxide has been applied. A coating of a photoresist material is applied over the exposed surface of the layer of indium tin oxide and a hardened portion is formed therein of the pattern desired. The substrate with the hardened pattern of photoresist on the indium tin oxide layer is immersed in a solution of concentrated hydrobromic acid for a time sufficient to etch away the indium tin oxide unmasked by the hardened photoresist. Thereafter the hardened photoresist is removed from the layer of indium tin oxide.

The novel features which are believed to be characteristic of the present invention are set forth with particularity in the appended claims. The invention itself both as to its organization and method of operation together with further objects and advantages thereof may best be understood by reference to the following description taken in connection with the accompanying drawings wherein FIG. 1 is a perspective view of a body which includes a suitable substrate on which a layer of indium tin oxide has been formed.

FIG. 2 is a plan view of the body of FIG. 1 after processing in accordance with the present invention to form a pair of closely spaced conductive stripes of indium tin oxide thereon.

FIG. 3 is a sectional view of FIG. 2 taken along section lines 3—3.

Referring now to FIG. 1 there is shown a composite body 10 including a substrate 11 on which has been deposited a layer 12 of indium tin oxide. The substrate may constitute an elemental semiconductor material such as silicon or germanium or a compound semiconductor material such as gallium arsenide or gallium phosphide. The substrate may also comprise an insulating material such as silicon dioxide, silicon nitride and aluminum oxide. The substrate may also comprise a plurality of materials, for example, including an underlying layer of silicon on which is formed a layer of an insulating material such as silicon dioxide on which in turn a layer of indium tin oxide has been sputtered to a suitable thickness.

FIG. 2 shows a pair of conductive electrodes 15 and 16 constituting a desired pattern formed in the layer of indium tin oxide in accordance with the process of the present invention. The electrodes or stripes are shown in the form of straight stripes with adjacent edges closely spaced. In accordance with the present invention such edges can be formed closer than 1 micron in layers of indium tin oxide with appreciable thickness, that is, of the order of 0.5 microns. FIG. 3 is a sectional view through stripe 16.

The present invention will be described in connection with a specific example. A layer 12 of indium tin oxide 0.5 micron thick is sputtered on a substrate 11 of silicon dioxide to form body 10 of FIG. 1. The sputtering is accomplished in r–f sputtering apparatus in which the target electrode is a disc of pressed and sintered indium oxide and tin oxide in the proportion of about 90% indium oxide and 10% tin oxide and in which the atmosphere is argon. The body is annealed at about 400°C for 10 minutes to densify the indium tin oxide and also to improve the conductivity thereof. Thereafter the body is suitably prepared for the application of a photoresist material thereto, for example, Waycoat negative resist made by Philip A. Hunt Chemical Corp. of Palisades Park, New Jersey. The preparation includes prebaking the wafer at 125°C for about ½ hour. Next, the resist having suitable viscosity of about 43 centipoise is applied to the surface of the indium tin oxide and is spun for a short period of time to form a uniform coating of the resist of about 4 to 5 microns thereon. The body with the resist thereon is appropriately cured by placing in another oven maintained at a temperature of 80°C for 20 minutes. A dark photomask having a pair of transparent portions corresponding to the electrodes 15 and 16 thereon is juxtaposed to the surface of the cured resist. Ultraviolet light is next directed onto the resist through transparent portions of the mask for a sufficient period of time and of sufficient intensity to cause hardening or polymerization of the portions of the resist exposed to ultra-violet light. After exposure the resist is put through a developing process in which the unhardened or unpolymerized portions of the resist are completely removed in a sequence of steps which includes developing, rinsing, cleaning and drying. After the developing sequence the body is run through a post bake step at 120°C for ¾ hour to fully polymerize the hardened portions of the photosensitive resist and also to enhance the adhesiveness of the layer of resist to the substrate. The foregoing steps of applying resist and developing a hardened pattern are well known to those skilled in the art.

In accordance with the present invention the body with the hardened pattern of resist thereon is immersed in a solution of concentrated hydrobromic acid for a time sufficient to etch away the indium tin oxide which is now exposed and which is unmasked by the hardened resist. I have found that with a concentrated hydrobromic acid solution of 48% hydrogen bromide and with an indium tin oxide layer thickness of about 0.5 micron that all of the exposed indium oxide is etched away without any lifting of the hardened resist. With the 48% concentrated solution of hydrobromic acid the etching action occurs in about 20 minutes. The hydrobromic acid had imperceptible effect on the silicon dioxide substrate. Thereafter the hardened resist is removed in a suitable photoresist stripper such as Chem Strip made by Mallinckrodt Chemical Company of St. Louis, Missouri. After suitable rinsing the body is now ready for subsequent processing.

In accordance with the present invention it was found that the layers of indium tin oxide about 0.5 micron thick applied to a substrate of silicon oxide and processed as described above to produce stripes, such as electrodes 15 and 16, had straight edges with deviations from a straight line of less than 0.3 micron thereby enabling a close spacing of edges of adjacent electrodes or stripes of indium tin oxide to within less than 1 micron.

In the process described above in which a concentrated solution of 48% hydrobromic acid was utilized on a silicon dioxide substrate and in which Waycoat photoresist was applied as indicated in a desired pattern on the indium tin oxide layer, it was found that good adherence between the patterned photoresist and the indium tin oxide layer was obtained for at least 20 minutes.

While the invention has been described in connection with a negative photoresist material such as Waycoat negative photoresist, the invention is equally applicable to the use of other negative photoresists and positive photoresists as well such as positive photoresist AZ 13J05 supplied by Shipley Company of Newton, Mass. Positive photoresist materials are materials which are applied in essentially hardened or polymerized form and the action of ultra-violet light thereon is to depolymerize the photoresist material which may then be readily removed by the developing process.

While a highly concentrated solution of hydrobromic acid was used in the process described above it will be readily apparent that less concentrated solutions work as well, however, the rate of etch through the indium tin oxide would be less than with a more concentrated solution.

While a thickness of 0.5 micron of indium tin oxide was used in explaining the method of the invention, it will be appreciated that this is not a limiting thickness. While the composition of the indium tin oxide in connection with which the process was described had about 90% indium oxide and 10% tin oxide, it will be understood that the process will work for compositions of indium tin oxide in which the indium tin oxide is included in a lesser percentage than 90% in the composite material, although a substantially greater percentage of the indium tin oxide should be indium oxide.

While the process has been described in connection with the application of the indium tin oxide to silicon dioxide, it should be understood that the process is equally applicable to the direct application of the indium tin oxide to an elemental semiconductor such as silicon as well as germanium and also it is equally applicable to the application of the indium tin oxide to other insulating layers such as silicon nitride, mixtures of silicon dioxide and silicon nitride and aluminum oxide. Also, the invention is equally applicable to bodies in which the indium tin oxide is applied to a semiconductor substrate such as gallium arsenide and gallium phosphide.

While the etching of indium tin oxide has been described as taking place at room temperature, it will be understood that the etching may be accomplished at higher temperatures as well. While photoresist integrity and adhesion is not as severely affected by higher temperature etching, the etch rate is increased at higher temperatures. Accordingly, use of higher temperatures is preferred for etching thicker layers of indium tin oxide, for example layers of the order of 1 micron.

While the invention has been described in a specific embodiment it will be appreciated that modifications may be made by those skilled in the art and it is intended by the appended claims to cover all such modifications and changes as fall within the true spirit and scope of the invention.

What I claim as new and desire to secure by Letters Patent of the United States is:

1. A method of etching a first pattern in a layer of indium tin oxide on a surface of a substrate comprising
    applying a coating of photoresist material over the exposed surface of said layer of indium tin oxide,
    forming in said coating a hardened pattern identical to said first pattern and exposing said layer of indium tin oxide unmasked by said hardened pattern,
    immersing said substrate with said hardened photoresist thereon in a solution of hydrobromic acid for a time sufficient to etch away indium tin oxide unmasked by said hardened photoresist,
    removing said hardened photoresist from said layer of indium tin oxide.

2. The method of claim 1 in which said photoresist material is a positive photoresist material.

3. The method of claim 1 in which said photoresist material is a negative photoresist material.

4. The method of claim 1 in which said solution of hydrobromic acid is a concentrated solution.

5. The method of claim 4 in which said concentrated solution comprises aqueous solution of about 48% hydrogen bromide by weight.

6. The method of claim 1 in which said substrate with said hardened photoresist thereon is immersed in a solution of concentrated hydrobromic acid for less than 20 minutes at substantially room temperature.

7. The method of claim 1 in which said layer of indium tin oxide is less than 1 micron in thickness.

8. The method of claim 1 in which the major constituent by weight of said indium tin oxide is indium oxide.

9. The method of claim 8 in which said indium tin oxide comprises about ninety per cent by weight of said indium tin oxide.

10. The method of claim 1 in which said layer of indium tin oxide is annealed to densify and increase the conductivity thereon prior to the application of said coating of photoresist thereto.

11. The method of claim 1 in which said substrate comprises an elemental semiconductor from the class of silicon and germanium.

12. The method of claim 1 in which said substrate comprises a compound semiconductor material from the class of gallium arsenide and gallium phosphide.

13. The method of claim 1 in which said substrate comprises an insulating material from the class of silicon dioxide, silicon nitride, mixtures of silicon dioxide and silicon nitride and aluminum oxide.

* * * * *